United States Patent
Akaogi

(10) Patent No.: US 6,587,395 B2
(45) Date of Patent: Jul. 1, 2003

(54) SYSTEM TO SET BURST MODE IN A DEVICE

(75) Inventor: Takao Akaogi, Cupertino, CA (US)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/943,713

(22) Filed: Aug. 30, 2001

(65) Prior Publication Data

US 2002/0181316 A1 Dec. 5, 2002

Related U.S. Application Data

(60) Provisional application No. 60/294,549, filed on May 30, 2001.

(51) Int. Cl.$^7$ ................................. G11C 8/00
(52) U.S. Cl. ............... 365/233; 365/230.08; 365/233.5
(58) Field of Search ............................ 365/233, 230.08, 365/233.5, 230.01

(56) References Cited

U.S. PATENT DOCUMENTS 5,548,560 A * 8/1996 Stephens, Jr. et al. ...... 365/194
5,666,321 A * 9/1997 Schaefer ..................... 365/233

\* cited by examiner

*Primary Examiner*—Hoai Ho
(74) *Attorney, Agent, or Firm*—Sheppard Mullin Richter & Hampton LLP

(57) ABSTRACT

System to set burst mode in a memory device. The system includes apparatus having a first signal buffer that receives an address control signal and produces a buffered address control signal. A mode detection circuit is included that receives the buffered address control signal and produces a burst control signal. The apparatus also includes a core access trigger circuit that receives the burst control signal and generates a core access signal that is used to begin a core access for burst mode operation of the memory.

6 Claims, 5 Drawing Sheets

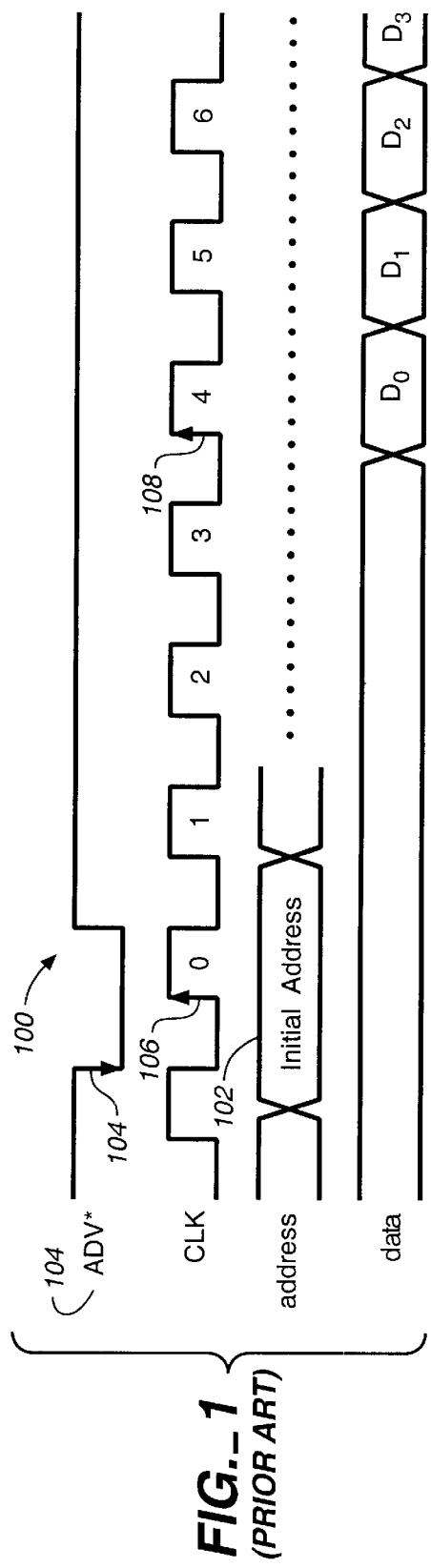
FIG._1
*(PRIOR ART)*
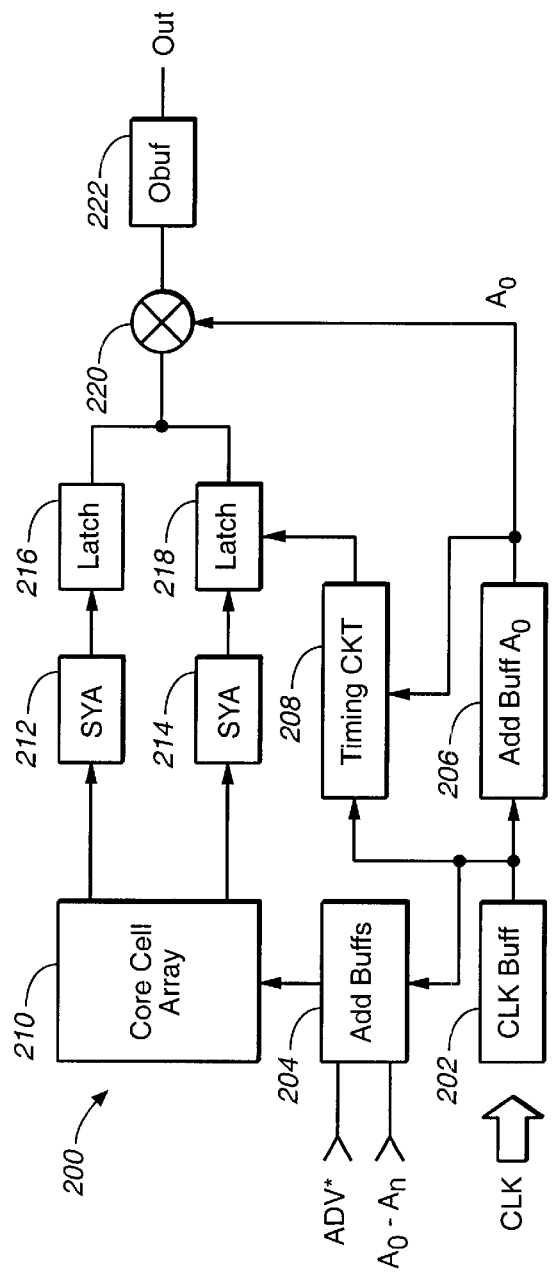
FIG._2
*(PRIOR ART)*

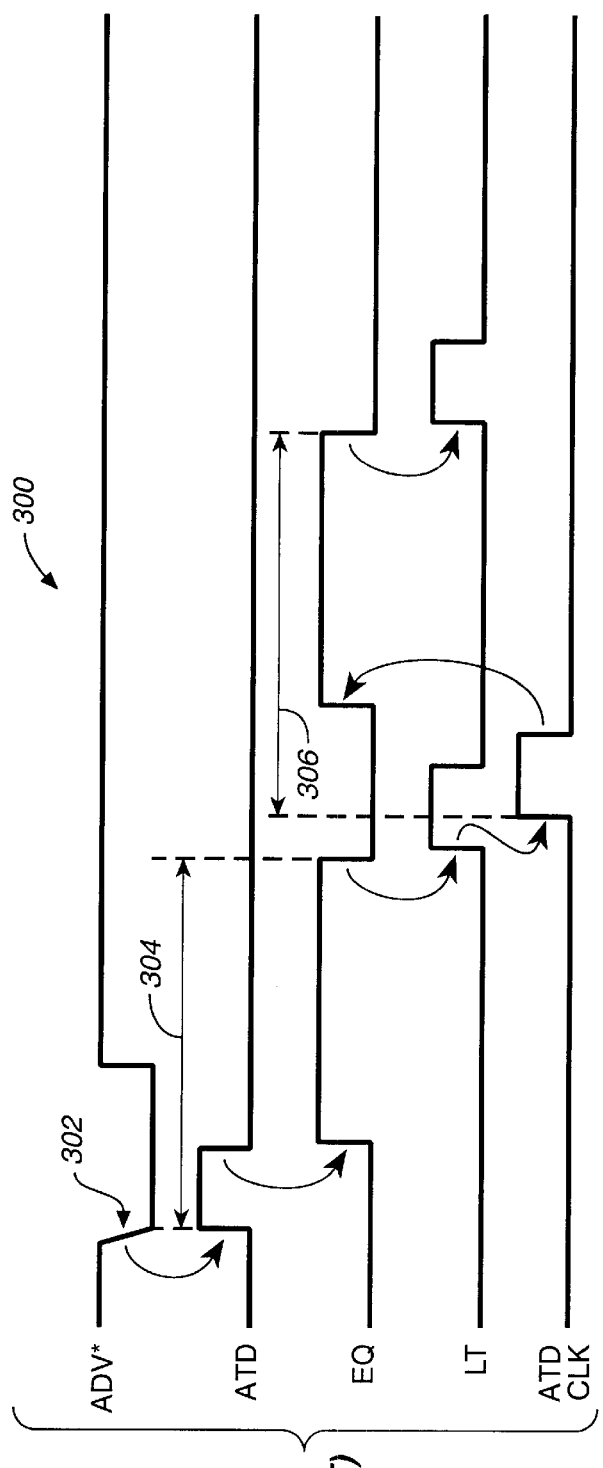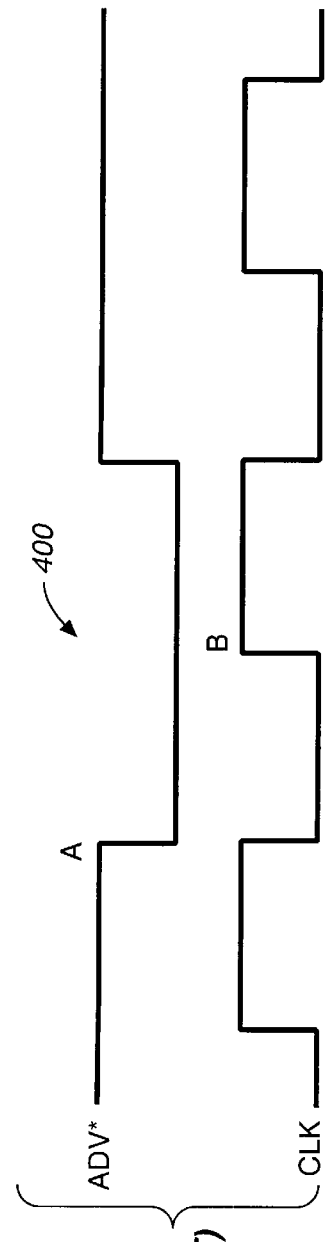
FIG._3 (PRIOR ART)
FIG._4 (PRIOR ART)

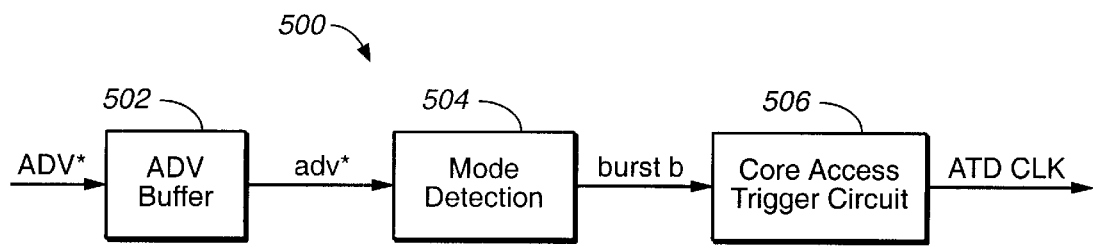
FIG._5
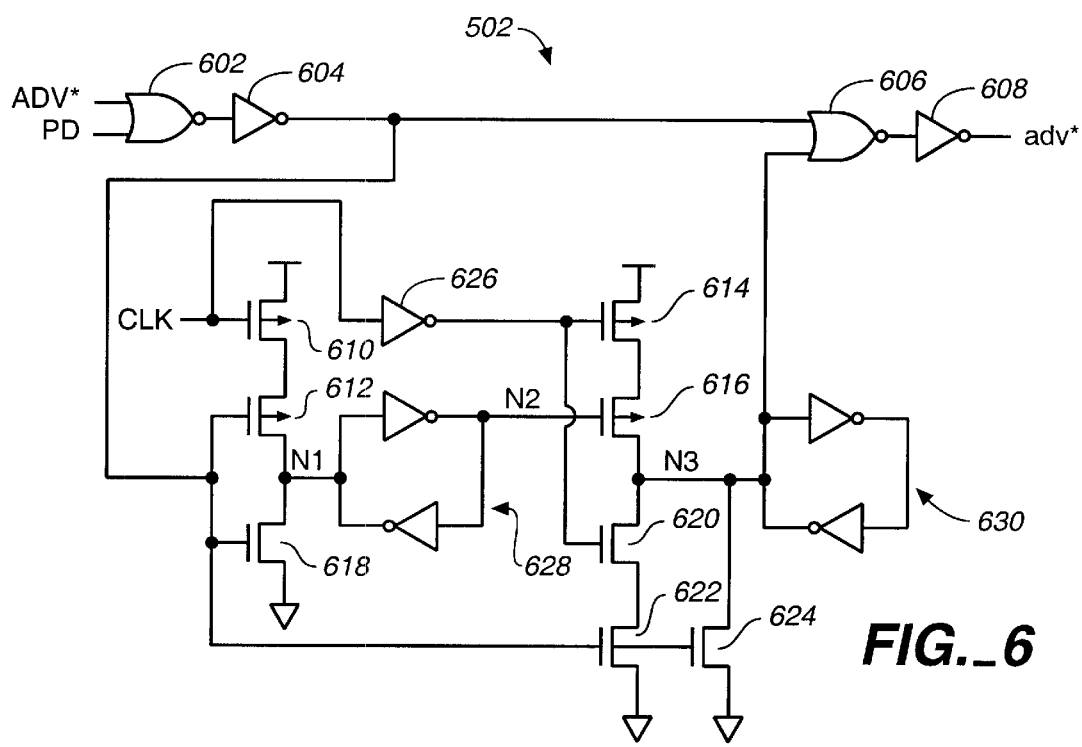
FIG._6
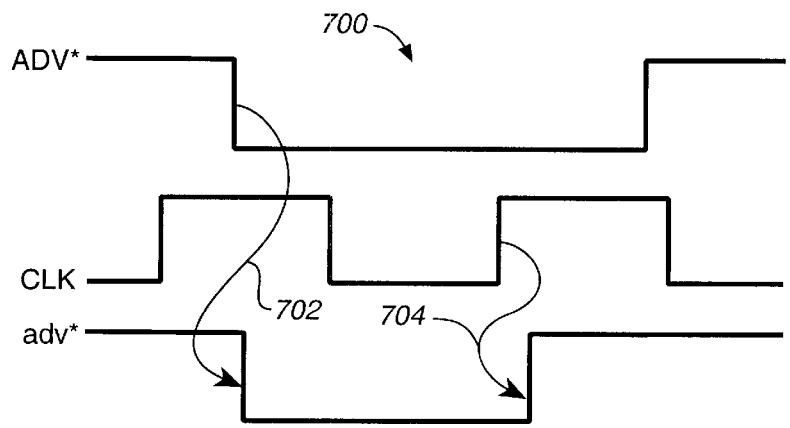
FIG._7
(PRIOR ART)

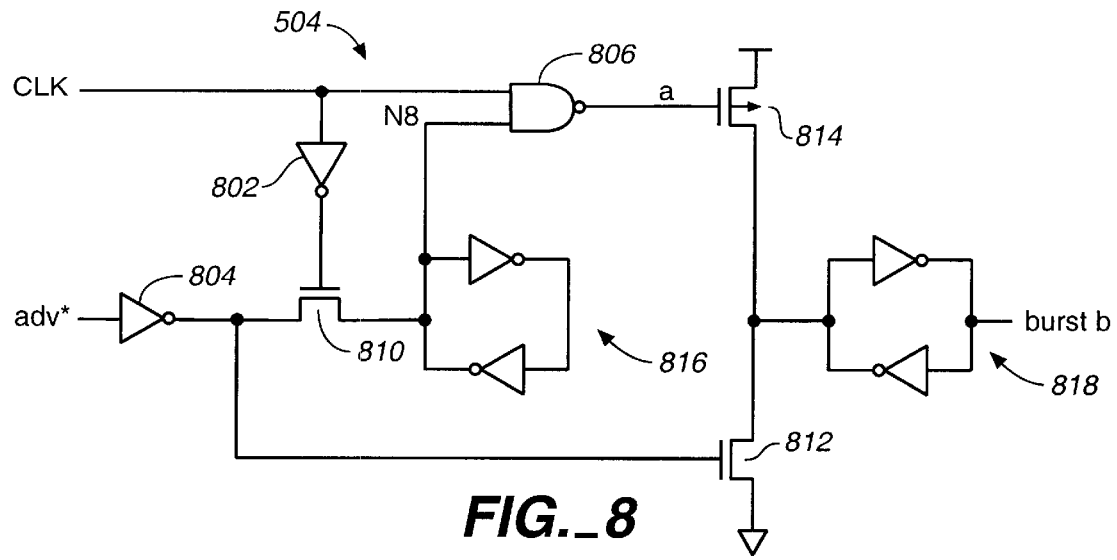
FIG._8
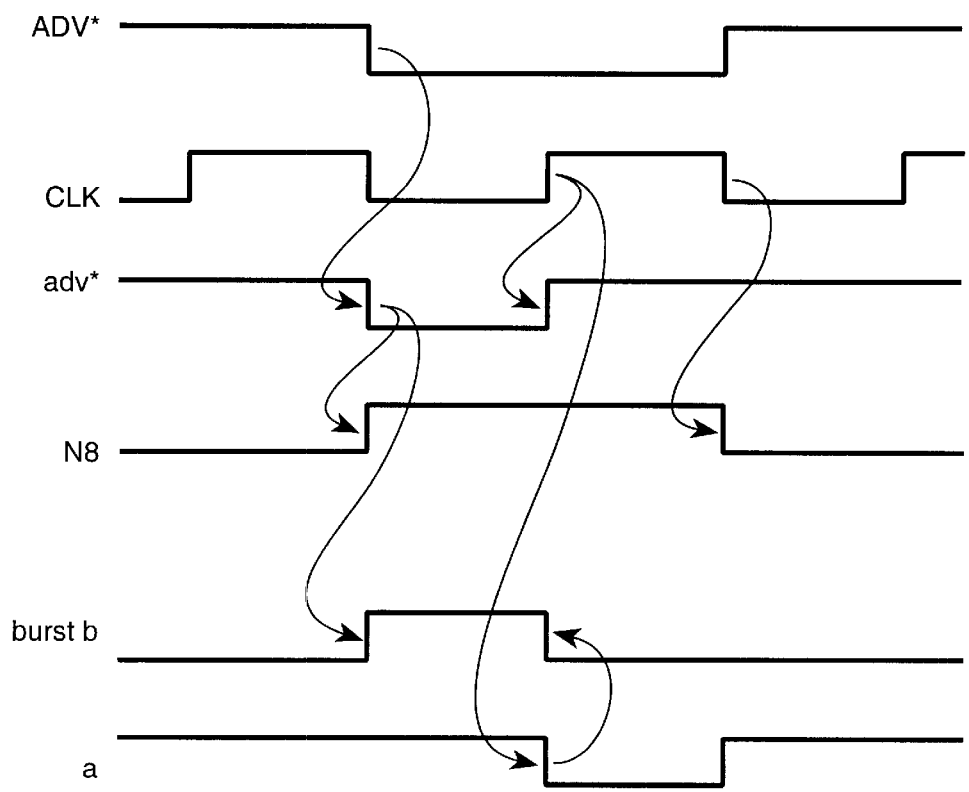
FIG._9

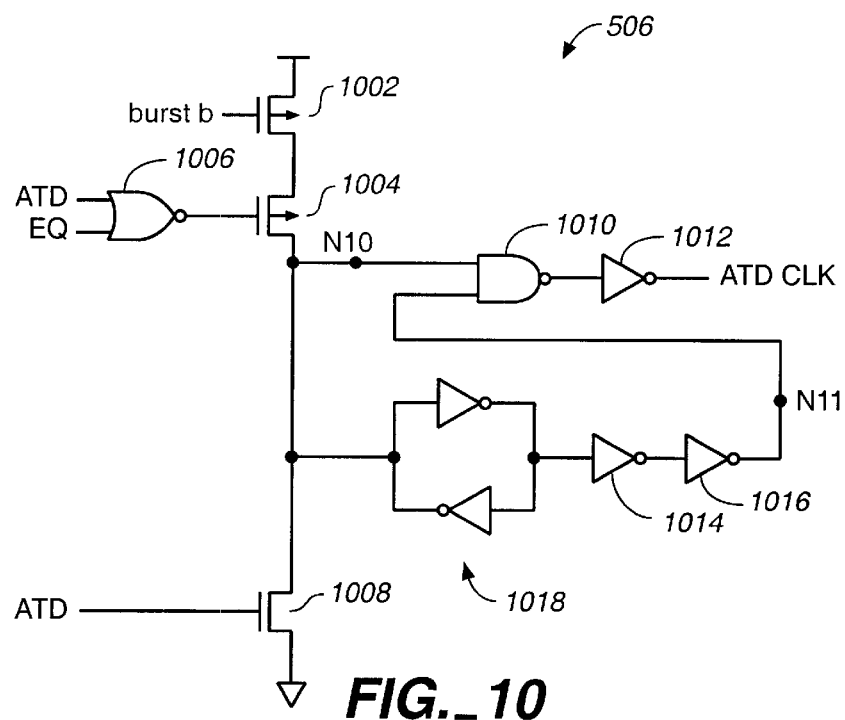
FIG._10
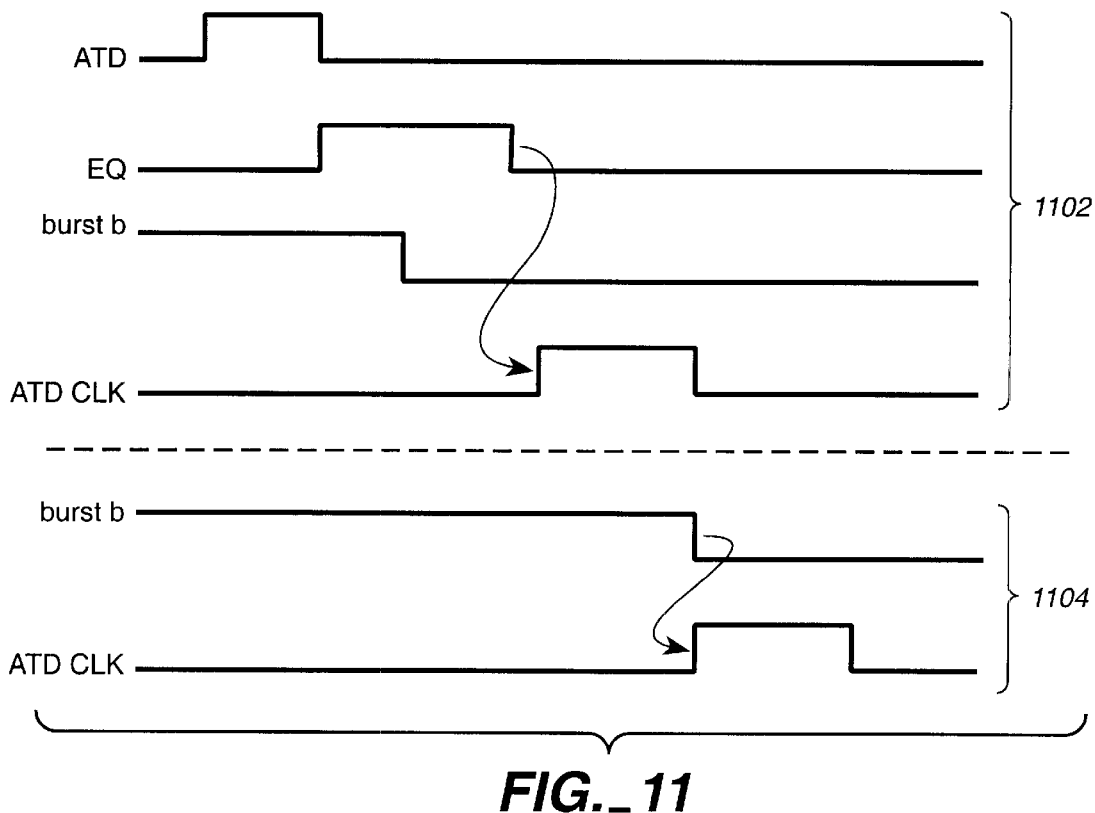
FIG._11

SYSTEM TO SET BURST MODE IN A DEVICE

CROSS REFERENCE TO RELATED APPLICATIONS

This application claims priority from a U.S. Provisional Patent Application entitled, "System to Set burst Mode in a Device" Application No. 60/294,549 invented by Mr. Takao Akaogi and filed on May 30, 2001. The disclosure of which in incorporated herein in its entirety for all purposes.

FIELD OF THE INVENTION

The present invention relates to semiconductor memory devices, and more particularly, to a system for providing burst mode transfers for use with memory devices.

BACKGROUND OF THE INVENTION

Semiconductor devices, such as memory devices, are commonly used as information storage devices in digital systems. As the amount of information that needs to be stored increases, it has become increasingly important to have an efficient way of accessing such memory devices.

Generally, memory read or write operations are initiated in response to external signals provided to the memory by a controller, such as a processor. In most cases, the amount of information that needs to be transferred during a memory access is large. In addition, the rate at which the information is propagated from a processor to a memory device and vice versa continues to increase. Therefore, increasing performance demands are being placed on the ability to read and write information to memory devices.

Information is transferred between a processor and a memory device via a data bus. However, a bus has limited bandwidth, and so, efficient bus utilization is generally highly desirable. For example, one way to read data from sequential address locations of a memory device is to transmit a sequence of read requests that include respective addresses of the data to be read. However, using this technique means that a substantial portion of the bus bandwidth is used as overhead to provide the address information. One way to reduce the required overhead is to use memory devices that include burst mode technology.

Burst mode technology is one way to efficiently utilize the bus and to increase bus bandwidth. A burst mode device can realize high performance due to its high data transfer capability. For example, a processor coupled to a burst mode memory device can read data from a number of sequential storage addresses by requesting a read operation that includes a starting address and a count parameter indicating the number of sequential addresses to read. The read request results in a continuous flow of data from the specified sequential addresses of the memory device without the requirement of requesting data from each address individually. This is referred to as synchronous operation and is available for both read and write operations. Thus, using the burst mode, it is possible to reduce instruction overhead and increase bus efficiency for synchronous operations.

However, burst mode technology memory devices are still required to perform normal random access operations (i.e., asynchronous operation), where accessing data associated with only one address or several random address locations is required. As a result, a typical burst mode device includes an additional interface pin (mode pin) or requires a special instruction (mode command) to differentiate between synchronous and asynchronous operations. However, this is undesirable since increasing the number of interface pins increases the size, cost and complexity of the device, and requiring additional mode commands increases overhead and decreases bus efficiency.

Therefore, it would be desirable to have a way to perform synchronous and asynchronous memory operations without having to add additional interface pins or special commands to differentiate between the modes of operation.

SUMMARY OF THE INVENTION

The present invention includes a system for differentiating between synchronous and asynchronous modes of operation associated with a memory device and generating burst mode control signals accordingly. The system determines a mode of operation from signals associated with accessing the device. Furthermore, the operating mode determination is independent of the clock signal timing, so that clock timing restrictions found in conventional circuits are avoided. This eliminates the need for additional interface pins or special mode commands.

In one embodiment of the present invention, apparatus is provided to set a burst mode in a memory device. The apparatus includes a first signal buffer that receives an address control signal and produces a buffered address control signal. A mode detection circuit is included that receives the buffered address control signal and produces a burst control signal. The apparatus also includes a core access trigger circuit that receives the burst control signal and generates a core access signal that is used to begin a core access for burst mode operation of the memory.

In another embodiment of the present invention, a method is provided for setting a burst mode in a memory device. The method includes the steps of receiving an address control signal to produce a buffered address control signal, producing a burst control signal from the buffered address control signal, and generating a core access signal from the burst control signal, the core access signal is used to begin a core access for burst mode operation of the memory.

BRIEF DESCRIPTION OF THE DRAWINGS

The foregoing aspects and the attendant advantages of this invention will become more readily apparent by reference to the following detailed description when taken in conjunction with the accompanying drawings wherein:

FIG. 1 shows a timing diagram of typical signals associated with accessing a memory device using burst mode operation;

FIG. 2 shows a block diagram of a typical memory device capable of burst mode operation;

FIG. 3 shows a timing diagram of signals associated with a first and second core access of a cell array included in the memory device of FIG. 2;

FIG. 4 shows a typical timing diagram for activating synchronous mode operation in a memory device;

FIG. 5 shows a block diagram of a burst mode circuit constructed in accordance with the present invention;

FIG. 6 shows a detailed view of an address control signal buffer;

FIG. 7 shows a timing diagram illustrating signal timing of signals associated with the address control signal buffer of FIG. 6;

FIG. 8 shows one embodiment of a mode circuit constructed in accordance with the present invention;

FIG. 9 shows a timing diagram illustrating signal timing of signals associated with the mode circuit of FIG. 8;

FIG. 10 shows a core access trigger circuit constructed in accordance with the present invention; and FIG. 11 shows a timing diagram illustrating signal timing of signals associated with the core access trigger circuit of FIG. 10.

DETAILED DESCRIPTION OF THE INVENTION

The present invention includes a system for differentiating between synchronous and asynchronous modes of operation associated with a memory device and generating burst mode control signals accordingly. The system provides differentiation between modes by determining the desired mode from selected signals associated with accessing the memory device. Thus, there is no need for additional interface pins or special mode control commands to begin operation in either of the two modes. Furthermore, the operating mode determination is independent of the clock signal timing, so that clock timing restrictions found in conventional circuits are avoided.

Burst Mode Operation

FIG. 1 shows a timing diagram 100 of typical signals associated with accessing a memory device using burst mode operation. An initial address 102 is available at a negative transition of an address control signal referred to as an address advance (ADV*) signal, as shown at 104. The ADV* signal remains at a low level for a selected time period. The initial address 102 is latched on the rising edge of a CLK signal during the time that the ADV* signal is at the low level, as shown at 106. Burst mode operation can begin once the initial address is latched and a predetermined number of CLK cycles occurs. For example, burst mode data (D0–D1) becomes available at the rising edge of the CLK signal indicated at 108. The burst mode data is the data located at the initial address and some number of sequential addresses from the initial address.

FIG. 2 shows a block diagram of a typical memory device 200 capable of burst mode operation. The device includes a clock buffer 202, address buffer 204, address buffer A0 206, timing circuit 208, a core cell array 210, two sense amplifier circuits 212, 214, two latch circuits 216, 218, an output circuit 220, and an output buffer 222.

The latch circuits 216, 218 temporarily store the output of the sense amplifier circuits 212, 214, so that the device can send out the stored data while simultaneously reading data from the core cell 210 that will be sent out during subsequent CLK cycles of the burst mode access.

The output of the address buffer A0 206 is toggled with every rising edge of the CLK signal to select one of the latch circuits 216, 218 to output data. The timing circuit 208 generates a latch signal 224 to the latch circuits 216, 218 to latch the data output from the sense amplifier circuits 212, 214 into the latch circuits 216, 218, respectively, when the signal A0 transitions from a high state to a low state.

A core access refers to an access of data within an address location of the cell array 210. During burst mode operation, when a first core access is started, data is read from a selected location of the core cell array 210. The data is transferred into the latch circuits 216, 218 so that the data can be transferred to the output immediately. After completing the first core access, the device will begin to read data from the core cell from the next sequential address location, which begins the second core access 306. The second core access is triggered by a signal indicating the end of the first core access.

FIG. 3 shows a timing diagram 300 of signals associated with a first and second core access of the memory device 200. A falling edge of the ADV* signal shown at 302 indicates that a new address is ready and thereafter, an address transition detected (ATD) signal is generated to initiate the first core access. The ATD signal goes active when it is detected that a new address is available. An equalization (EQ) signal indicates that a core access is in progress (i.e. the sense amplifiers are stabilizing), and so at the falling edge of the EQ signal, the current core access is complete. As a result, the duration of the first core access is indicated at 304.

When the first core access is finished, a latch (LT) signal goes high to indicate that the accessed data can be latched into temporary storage, for example, latch registers 216, 218. For burst mode operation in a conventional circuit, the rising edge of the LT signal triggers an ATD CLK that initiates the second core access. Thus, as part of burst mode operation, a new address is generated and detected as indicated by the ATD CLK signal. This process of accessing sequential core address locations continues until the burst is complete. When outputting the retrieved data, the first and second core accesses may need to be completed before the CLK indicated in FIG. 1, starts clocking data out from the device.

FIG. 4 shows a typical timing diagram 400 for activating synchronous mode operation in a memory device. To achieve synchronous mode operation, the ADV* signal goes to a low state at the falling edge of the CLK signal (as shown at A) and stays low for at least one CLK cycle. Thus, a rising edge of the CLK signal occurs during the ADV* low time period, which activates synchronous mode operation.

The synchronous mode (burst mode) is activated with the rising edge of the CLK signal (as shown at B) that occurs in the first core access period. Since the core access may last 60–70 nanoseconds (ns), to provide a rising edge of the CLK signal during this time, the cycle time of the CLK signal should be less than 120–140 ns (8.3 MHz~7.1 MHz). As a result, the minimum clock frequency for use with the memory device is limited.

Asynchronous Mode

Referring again to FIG. 3, in the case of asynchronous operation only one core access is performed. As a result, the LT signal does not generate the ATD CLK signal because just one random access is necessary (i.e., data from just one address is needed). Therefore, the ATD CLK is not generated, the next sequential address is not generated and the memory access completes after one access of the core.

The typical system has the capability to set operation to the asynchronous mode when the signal ADV* is low and the CLK signal remains low. Thus, if there is no CLK signal during the low time period of the ADV* signal, asynchronous mode results. For synchronous mode, a rising edge of the CLK signal occurs during the low period of the ADV* signal in the first core access. This enables synchronous mode and allows additional core accesses as required. However, this means that the typical system is clock timing dependent.

Exemplary Embodiment

The present invention includes a system that can differentiate between burst mode and asynchronous operation without the timing limitations of conventional circuits. As a result, special mode pins or mode commands are not needed.

FIG. 5 shows a block diagram of a burst mode circuit 500 constructed in accordance with the present invention. The circuit 500 includes an ADV buffer 502 that receives the ADV* signal and produces an adv* signal that is a modified version of the ADV* signal. The adv* signal is received by a mode detection circuit 504 that generates a burst b signal that indicates whether synchronous or asynchronous operation has been requested. The burst b signal is received by a core access trigger circuit 506 that generates an ATD CLK depending on whether synchronous or asynchronous operation has been requested. The mode circuit 500 can be incorporated into the timing circuit 208 of the memory device of FIG. 2, or may be incorporated into a stand-alone circuit.

FIG. 6 shows a detailed view of the ADV buffer circuit 502. The circuit 502 receives the ADV* signal, the CLK signal and a power down (PD) signal to produce the adv* signal. The PD signal is used to place the memory device in a power down mode to suspend operation. It is also possible to combine other ancillary device signals to produce other operational modes, however, these other ancillary signals are not necessary to the operation of this embodiment of the invention, and so, they will not be described in detail.

The buffer circuit 502 includes NOR gate 602, inverter 604, NOR gate 606, and inverter 608. The circuit 502 also includes PMOS transistors 610, 612, 614 and 616, along with NMOS transistors 618, 620, 622 and 624. The CLK input coupled to the base terminal of transistor 610 and inverter 626. The circuit 502 also includes two latching circuits 628 and 630. The ADV buffer 502 also includes indications at node 1 (N1), node 2 (N2) and node 3 (N3), which will be used to further describe the operation of the circuit ADV buffer circuit 502 with reference to the following timing diagram.

FIG. 7 shows a timing diagram 700 illustrating signal timing of signals associated with the circuit 502. Assuming the PD signal is inactive, the ADV* signal is received by the circuit 502 as shown. The falling edge of the ADV* signal causes a falling edge of the adv* signal to occur as shown at 702. A rising edge of the CLK signal causes a rising edge of the adv* signal as shown at 704. Thus, the circuit 502 modifies the ADV* signal to form the adv* signal.

FIG. 8 shows one embodiment of the mode detection circuit 504 constructed in accordance with the present invention. The mode detection circuit 504 includes inverters 802, 804, NAND gate 806, NMOS transistors 810, 812, PMOS transistor 814 and latch circuits 816, 818. During operation of the mode detection circuit 504, the CLK and adv* signal are used to produce a burst b signal that goes low only when the CLK signal goes high during a time when the adv* signal is low. Node N8 is used to reference an intermediate signal that will be used to describe operation of the mode detection circuit 504 with reference to the following timing diagram.

FIG. 9 shows a timing diagram illustrating signal timing of signals associated with the mode detection circuit of FIG. 8. The burst b signal is shown going to a high level when the clock (CLK) signal goes high after the adv* signal goes low.

FIG. 10 shows one embodiment of the core access trigger circuit 506 constructed in accordance with the present invention. The core access trigger circuit 506 includes PMOS transistors 1002, 1004, NOR gate 1006, PMOS transistor 1008, NAND gate 1010, inverters 1012, 1014, 1016, and latch circuit 1018.

During operation of the trigger circuit 506, if the burst b signal goes low during the ATD signal or the EQ signal (during the first core access period), the falling edge of the EQ signal (same timing as the LT going high) will generate the ATD CLK signal. Alternatively, if the burst b signal goes low after the first core access finishes, then the falling edge of the burst b signal will generate the ATD CLK signal to start the next core access. Thus, the burst mode operation can be set without any clock frequency limitations.

The trigger circuit 506 also includes nodes N10 and N11, which reference intermediate signals that will be used to describe operation of the mode detection circuit with reference to the following timing diagram.

FIG. 11 shows a timing diagram illustrating signal timing of signals associated with the core access trigger circuit of FIG. 10. Referring to the top portion of the timing diagram (1102), the burst b signal is shown transitioning to a low level within the first core access period, and as a result, the ATD CLK is generated on the falling edge of the EQ signal. Referring to the bottom portion of the timing diagram (1104), the burst b signal is shown transistion to a low level outside the first core access period (i.e., the falling edge of the EQ signal). However, the ATD CLK is still generated so that a burst mode operation is performed. Thus, the system constructed in accordance with the present invention operates to set burst mode operation with clock frequency limitations. Conventional circuits need to have a clock signal that meets certain frequency parameters to activate the burst mode. The system also operates to prevent accidental activation of burst mode The present invention includes a system for differentiating between synchronous and asynchronous modes of operation associated with a memory device and generating burst mode control signals accordingly. The embodiments described above are illustrative of the present invention and are not intended to limit the scope of the invention to the particular embodiments described. Accordingly, while one or more embodiments of the invention have been illustrated and described, it will be appreciated that various changes can be made therein without departing from the spirit or essential characteristics thereof. Accordingly, the disclosures and descriptions herein are intended to be illustrative, but not limiting, of the scope of the invention which is set forth in the following claims.

What is claimed is:

1. Apparatus to set burst mode operation in a memory device, the apparatus comprising:

a first signal buffer that receives an address control signal and produces a buffered address control signal;

a mode detection circuit that receives the buffered address control signal and a system clock signal and produces a burst control signal, the burst control signal generated if the system clock signal is activated during a time when the buffered address control signal is active; and a core access trigger circuit that receives the burst control signal and generates a core access signal that is used to begin a next core access for burst mode operation of the memory, wherein if said burst control signal is activated outside a core access period, said core access signal is generated when said burst control signal is activated, if said burst control signal is activated within the core access period, said core access signal is generated when said core access finishes.

2. The apparatus of claim 1, wherein the mode detection circuit comprises:

a first input to receive the system clock signal;

a second input to receive the buffered address control signal; and a latch circuit having a latch output that outputs the burst control signal.

3. The apparatus of claim 1, wherein the core access trigger circuit comprises:

a receiver circuit that receives the burst control signal, an address detection signal and a core access indicator signal indicating the core access period; and an output circuit coupled to the receiver circuit that outputs the core access signal.

4. The apparatus of claim 3, wherein the output circuit of the core access trigger circuit further comprises a latch circuit coupled to the receiver circuit.

5. A method for setting a burst mode in a memory device, the method comprising steps of:

receiving an address control signal to produce a buffered address control signal;

producing a burst control signal from the buffered address control signal and a system clock, wherein the burst control signal generated if the system clock signal is activated during a time when the buffered address control signal is active; and generating a core access signal from the burst control signal, the core access signal is used to begin a next core access for burst mode operation of the memory, wherein if said burst control signal is activated outside a core access period, said core access signal is generated when said burst control signal is activated, if said curst control signal is activated within the core access period, said core access signal is generated when said core access finishes.

6. The method of claim 5, wherein the step of generating the core access signal is a step of generating the core access signal outside the first core access period.

* * * * *